United States Patent
Eilbeck

(10) Patent No.: US 6,790,582 B1
(45) Date of Patent: Sep. 14, 2004

(54) PHOTORESIST COMPOSITIONS

(75) Inventor: J. Neville Eilbeck, Near Buckingham (GB)

(73) Assignee: Clariant Finance BVI Limited (VG)

( * ) Notice: Subject to any disclaimer, the term of this patent is extended or adjusted under 35 U.S.C. 154(b) by 0 days.

(21) Appl. No.: 10/404,612

(22) Filed: Apr. 1, 2003

(51) Int. Cl.⁷ .............................................. G03F 7/023
(52) U.S. Cl. ..................... 430/190; 430/191; 430/192; 430/193; 430/326
(58) Field of Search ................................ 430/190, 191, 430/192, 193, 165, 326

(56) References Cited

U.S. PATENT DOCUMENTS

| | | | | |
|---|---|---|---|---|
| 3,635,709 A | 1/1972 | Kobayashi | ................... | 430/190 |
| 4,529,682 A | 7/1985 | Toukhy | ...................... | 430/190 |
| 4,632,891 A | 12/1986 | Banks et al. | .................. | 430/18 |
| 4,959,292 A | 9/1990 | Blakeney et al. | ........... | 430/165 |
| 4,988,601 A | 1/1991 | Ushirogouchi et al. | ..... | 430/192 |
| 5,001,040 A | 3/1991 | Blakeney et al. | ........... | 430/326 |
| 5,145,763 A | 9/1992 | Bassett et al. | ............. | 430/169 |
| 5,238,775 A | 8/1993 | Kajita et al. | ................ | 430/192 |
| 5,279,918 A | 1/1994 | Nishi et al. | ................. | 430/190 |
| 5,290,656 A | 3/1994 | Uetani et al. | ............... | 430/165 |
| 5,413,896 A | 5/1995 | Kajita et al. | ................ | 430/192 |
| 5,422,221 A | 6/1995 | Okazaki et al. | ............. | 430/190 |
| 5,529,880 A | 6/1996 | Zampini et al. | ............ | 430/190 |
| 5,589,553 A | 12/1996 | Zampini et al. | ............. | 525/504 |
| 5,700,620 A | 12/1997 | Sakaguchi et al. | .......... | 430/191 |
| 5,932,396 A * | 8/1999 | Kamijima | .................... | 430/320 |
| 6,210,855 B1 * | 4/2001 | Ueda et al. | ................. | 430/190 |
| 6,218,069 B1 * | 4/2001 | Kato et al. | .................. | 430/190 |
| 6,242,151 B1 * | 6/2001 | Furihata et al. | ............. | 430/190 |
| 6,379,859 B2 | 4/2002 | Suzuki et al. | ............... | 430/191 |
| 6,436,601 B1 * | 8/2002 | Seth et al. | .................. | 430/190 |
| 6,451,496 B2 * | 9/2002 | Ueda et al. | ................. | 430/190 |
| 6,475,693 B1 * | 11/2002 | Susukida et al. | ........... | 430/190 |
| 6,503,682 B1 | 1/2003 | Kim et al. | .................. | 430/192 |
| 2001/0018160 A1 * | 8/2001 | Ueda et al. | ................. | 430/190 |

FOREIGN PATENT DOCUMENTS

| | | |
|---|---|---|
| EP | 0 443 533 A2 | 8/1991 |
| EP | 0 554 101 A1 | 8/1993 |
| GB | 1 227 602 | 4/1971 |
| GB | 1 546 633 | 5/1975 |
| JP | 64-35435 | 2/1989 |

OTHER PUBLICATIONS

English language translation of JP64–35435.

* cited by examiner

*Primary Examiner*—John S. Chu
(74) *Attorney, Agent, or Firm*—Alan P Kass

(57) ABSTRACT

The present invention relates to a composition and a process for preparing a composition that comprises: a) a novolak resin partially esterified with from about 3 to about 7 weight percent of a naphthoquinonediazidosulfonyl group; b) one or more dilution resins; and c) at least one solvent.

16 Claims, No Drawings

PHOTORESIST COMPOSITIONS

BACKGROUND OF THE INVENTION

The present invention relates to a light-sensitive photoresist composition and a process for producing such a composition. In particular, the subject invention relates to a photoresist composition comprising: a composition comprising: a) a novolak resin partially esterified with from about 3 to about 7 weight percent of a naphthoquinonediazidosulfonyl group; b) one or more dilution resins; and c) at least one solvent. Such a photoresist composition provides a positive photoresist that exhibits low absorption for thicker films, good photospeed, adjustable contrast, good shelf life stability, low outgassing potential, substantially no crystallization, excellent coating properties and broadband sensitivity.

Photoresist compositions are used in microlithography processes for making miniaturized electronic components, such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked-coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed (in the case of positive photoresist) or the unexposed (in the case of negative photoresist) areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating.

Again, a desired portion of the underlying substrate surface is uncovered. After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material that corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature that the resist composition can transfer from the photomask to the substrate with a high degree of image edge acuity after exposure and development. In many manufacturing applications today, resist resolution on the order of less than one micron is quite common. In addition, it is almost always desirable that the developed photoresist wall profiles be near vertical relative to the substrate. Such demarcations between developed and undeveloped areas of the resist coating translate into accurate pattern transfer of the mask image onto the substrate.

Efforts have been previously been made to attach DNQ groups to novolak resins. However, these efforts have been directed toward providing a resin that functions as both the film forming component and the photosensitizer. This enables the production of single component photoresists because it is not necessary to add a separate photoactive component to photosensitive the photoresist composition. One of the first patents relating to this technology was U.S. Pat. No. 3,046,120. An ortho-cresol/formaldehyde novolak resin was esterified with a naphthoquinone-(1,2)-diazide-(2)-5-sulfonyl chloride to provide a single component photosensitive composition that useful for the production of printing plates. Other patents that relate to these attempts to combine a photosensitive compound with a phenolic resin are U.S. Pat. Nos. 3,635,709; 4,123,279 and 4,306,011.

U.S. Pat. No. 5,178,986 relates to a light sensitive mixture useful as a positive acting photoresist. The mixture contains a compound that comprises the reaction product of a DNQ and an oligomeric phenol. More recent attempts to provide a photoresist composition comprising the esterification product of a phenolic resin and a DNQ are described in U.S. Pat. No. 5,279,918. An ortho-quinone diazide sulfonyl chloride was condensed with a relatively low molecular weight novolak resin, wherein from 40% to 90% of the phenolic hydroxy groups were condensed with the DNQ groups. This provided a high concentration of DNQ moieties on the novolak resin backbone.

In U.S. Pat. No. 5,422,221 a photoresist composition is disclosed wherein the novolak resin serves as both the alkali-soluble film-forming resin and the photosensitive component of the composition. This is accomplished by replacing the hydrogen atom of a hydroxyl group in the novolak resin with a DNQ group in a proportion of 0.03 to 0.27 mol per hydrogen atom (believed to be equivalent to 3 to 27% esterification). It was disclosed that more than 0.27 mol% [sic] substitution results in a novolak resin that is less soluble in the photoresist solvent and that less than 0.03 mol% [sic] substitution provides a novolak resin that is too low in film retentivity so that the resulting photoresist composition cannot be patterned and is, therefore, useless.

U.S. Pat. No. 5,529,880 discloses a photoresist composition comprising: 1) the esterification product of a DNQ and a novolak resin having pendant phenol hydroxyl groups and 2) the esterification product of a phenol having 2 to 5 phenyl rings and at least 4 phenolic hydroxy groups with a DNQ having at least 50% of its phenol hydroxyl groups esterified with the DNQ. The esterification reaction to produce esterification product 1) is controlled so that a maximum of 20% of the phenolic hydroxy groups are esterified.

U.S. Pat. No. 5,723,254 discloses a positive acting photoresist composition containing a mixture of photoactive components. One component of the mixture is the esterification product of a DNQ with a low molecular weight phenolic resin. Another component is the esterification product of a DNQ with a low molecular weight phenol having from 1 to 3 aryl rings and from 1 to 3 hydroxyl groups. A third photoactive component that may be present is the esterification product of a DNQ with a relatively high molecular weight polyhydric polynuclear phenol.

SUMMARY OF THE INVENTION

The present invention relates to a photoresist composition that comprises a composition comprising: a) a novolak resin partially esterified with from about 3 to about 7 weight percent of a naphthoquinonediazidosulfonyl group; b) one or more dilution resins; and c) at least one solvent. alkali-soluble, film forming phenolic resin preferably having a weight average molecular weight from about 1,000 to 30,000, preferably from about 1,500 to 10,000. The DNQ used for partial esterification of the novolak resin contains quinonediazide sulfonyl groups that replace the hydrogen atom of hydroxyl groups in the novolak resin. The one or more dilution resins dilute the amount of partially esterified novolak resin in the composition to allow for better solution, viscosity, and other physical and chemical benefits in the composition and the resulting photoresist. The solvent suitable for use in present invention may be any of those well known to those skilled in the art, but preferably is a solvent or solvent blend that can be selected from 2-heptanone, either alone or in combination with anisole; ethyl lactate, either alone or in combination with n-butyl acetate or propylene glycol methyl ether; or propylene glycol methyl ether, either alone or in combination with ethyl 3-ethoxypropionate.

The invention further comprises a process of forming an image on a substrate. The substrate is coated with a film of the photoresist composition of the instant invention. The photoresist film is imagewise exposed through a mask with ultraviolet radiation and processed in accordance with those steps known to those skilled in the art.

DETAILED DESCRIPTION OF THE INVENTION

The present invention relates to a photoresist composition that comprises: a) A composition comprising: a) a novolak resin partially esterified with from about 3 to about 7 weight percent of a naphthoquinonediazidosulfonyl group; b) one or more dilution resins; and c) at least one solvent.

The partially esterified novolak for the claimed composition is a water-insoluble, alkali-soluble, film forming phenolic resin preferably having a weight average molecular weight from about 1,000 to 30,000, preferably from about 1,500 to 10,000. The DNQ used for partial esterification of the novolak resin contains quinonediazide sulfonyl groups that replace the hydrogen atom of hydroxyl groups in the novolak resin. The one or more dilution resins dilute the amount of partially esterified novolak resin in the composition to allow for better solution, viscosity, and other physical and chemical benefits in the composition and the resulting photoresist. The solvent suitable for use in the present invention may be any of those well known to those skilled in the art, but preferably is a solvent or solvent blend that can be selected from 2-heptanone, either alone or in combination with anisole; ethyl lactate, either alone or in combination with n-butyl acetate or propylene glycol methyl ether; or propylene glycol methyl ether, either alone or in combination with ethyl 3-ethoxypropionate.

The invention further comprises a process of forming an image on a substrate. The substrate is coated with a film of the photoresist composition of the instant invention. The photoresist film is imagewise exposed through a mask with ultraviolet radiation and processed in accordance with those steps known to those skilled in the art.

Solutions containing partially esterified film-forming novolak resin with DNQ of the claimed composition are extremely viscous and are difficult to work with in formulating photoresist compositions. It has been found that by adding a dilution resin to a solution containing the partially esterified novolak resin, viscosity and other physical and chemical properties of the composition improve and the composition becomes very useful in forming photoresist.

The novolak resin that is partially esterified according to the present invention is prepared by subjecting a phenol or a substituted phenol to an addition-condensation reaction of a phenol or substituted phenol (or a combination thereof) and an aldehyde, including a formaldehyde generating source, or ketone (or a combination thereof), in the presence of an acid or a divalent metal salt catalyst, in a suitable reaction solvent, as are well known to one skilled in the art of photoresists. Suitable phenols include, but are not limited to, phenol, chlorophenols, fluorophenols, m-cresol, o-cresol, p-cresol, m-ethyl phenol, o-ethyl phenol, p-ethyl phenol, m-butyl phenol, o-butyl phenol, p-butyl phenol, trimethylsilylphenol, chloromethylphenol, 2,3-xylenol, 2,4-xylenol, 2,5xylenol, 2,6-xylenol, 3,4-xylenol, 3,5-xylenol, 3,6-xylenol, o-phenyl phenol, m-phenyl phenol, p-phenyl phenol, 2,3,5-trimethylphenol, 2,3,5-trimethylphenol, 3,4,5-trimethylphenol, 4-tert-butylphenol, 3-tert-butylphenol, 2-tert-butylphenol, 2-tert-butyl-4-methylphenol, 2-tert-butyl-5-methylphenol and other alkyl-substituted phenols; p-methoxyphenol, m-methoxyphenol, o-methoxyphenol, p-ethoxyphenol, m-ethoxyphenol, o-ethoxyphenol, o-propoxyphenol, p-propoxyphenol, m-propoxyphenol and other alkoxy-substituted phenols; o-isopropenylphenol, p-isopropenylphenol, 2-methyl-4-isopropenylphenol, 2-ethyl-4-isopropenylphenol and other isopropenyl-substituted phenols; phenylphenol and other aryl-substituted phenols; 4,4'-dihydroxybiphenyl, bisphenol A, hydroquinone, resorcinol, 2-methyl resorcinol, 5-methyl resorcinol, pyrogallol, catechol, and others as are well known to those skilled in the photoresist art. These phenols may be used either alone or in an admixture of two or more, depending upon the dissolution rate desired.

As for examples of the aldehyde, there may be used, either alone or in combination, those such as formaldehyde, paraformaldehyde, acetaldehyde, benzaldehyde, furfural, trioxane, propionaldehyde, butylaldehyde, trimethylacetaldehyde, acrolein (acrylaldehyde), crotonaldehyde, cyclohexanaldehyde, furylacrolein, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, cinnamaldehyde, salicylaldehyde, 2-chlorobenzaldehyde, 3-chlorobenzaldehyde, 4-chlorobenzaldehyde, 2-hydroxybenzaldehyde, 3-hydroxybenzaldehyde, 4-hydroxybenzaldehyde, 2-methoxybenzaldehyde, 3-methoxybenzaldehyde, 4-methoxybenzaldehyde, 2-nitrobenzaldehyde, 3-nitrobenzaldehyde, 4-nitrobenzaldehyde, propylaldehyde, phenylacetaldehyde, α-phenylpropylaldehyde, β-phenylpropylaldehyde, o-methylbenzaldehyde, m-methylbenzaldehyde, p-methylbenzaldehyde, p-ethylbenzaldehyde, para-n-butylbenzaldehyde, and the like and mixtures thereof. As a formaldehyde-generating source, used are formalin, trioxane, paraformaldehyde, and hemiformals such as methyihemiformal, ethylhemiformal, propylhemiformal, butylhemiformal, and phenylhemiformal.

Examples of the ketones include acetone, methyl ethyl ketone, diethyl ketone and diphenyl ketone. Each of these ketones may be used singly or in combination. Further, an optional combination of any of aldehydes and any of ketones can be employed.

As the acid catalyst, there may be utilized inorganic acids such as hydrochloric acid, nitric acid, sulfuric acid and the like, organic acids such as formic acid, oxalic acid, maleic acid and the like, and divalent inorganic metal salts of copper, cobalt, magnesium, manganese, nickel, zinc and the like. The reaction solvent is normally a hydrophilic solvent, such as methanol or dioxane. Preferred alkali-soluble, film forming novolak resins include phenol-formaldehyde novolaks, cresol-formaldehyde novolaks, and phenol-modified xylenol-formaldehyde novolaks.

According to the present invention, a novolak resin is partially esterified by replacing from about 3 to about 7 percent of the hydrogen atoms of its hydroxyl groups with a compound containing a naphthoquinonediazidosulfonyl (DNQ) group. Examples of suitable DNQ groups include a 1,2-naphthoquinonediazide-4-sulfonyl group, a 1,2-naphthoquinonediazide-5-sulfonyl group, a 7-methyl-1,2-naphthoquinonediazide-4-sulfonyl group, a 2,1-naphthoquinonediazide-4-sulfonyl group, a 2,1-naphthoquinonediazide-6-sulfonyl group, a 2,1-naphthoquinonediazide-7-sulfonyl group, and a 2,1-naphthoquinonediazide-8-sulfonyl group. These DNQ groups may be utilized alone or in combination, but the 1,2-naphthoquinonediazide-4-sulfonyl group and 1,2-naphthoquinonediazide-5-sulfonyl group are particularly preferred.

One or more dilution resins are added to the present composition. The dilution resins include, for example, the same novolak resins that are described above in a) except that they are not partially esterified with DNQ. Some of these novolak resins include, among others, a condensation product between trimethylphenol and formaldehyde and a condensation product between acetone and pyrogallol.

Other dilution resins include polyhydroxy phenol compounds such as, for example, 1,1-bis(4-hydroxyphenyl)1-[4-(4-hydroxybenzyl)phenyl]ethane, 1,1-bis(3,5-dimethyl-4-hydroxyphenyl)-1-[4-(4-hydroxybenzyl)phenyl]ethane, 1,1-bis(3,5-dimethyl-2-hydroxyphenyl)-1-[4-(4-hydroxybenzyl)phenyl]ethane, 1,1-bis(4-hydroxy-3-methylphenyl)-1-[4-(4-hydroxybenzyl)phenyl]ethane, 1,1-bis(2,6-dimethyl-4-hydroxyphenyl)-1-[4-(4-hydroxybenzyl)phenyl]ethane, 1,1-bis(3,4-dihydroxyphenyl)-1-[4-(4-hydroxybenzyl)phenyl]ethane, 1,1-bis(3,4,5-trihydroxyphenyl)-1-[4-(4-hydroxybenzyl)phenyl]ethane, 1,1-bis(3,5-dimethy-4-hydroxyphenyl)-1-[4-[1-(4-hydroxyphenyl)-1-methylethyl]phenyl]ethane, 1,1-bis(3,5-dimethyl-2-hydroxyphenyl)-1-[4-[1-(4-hydroxyphenyl)-1-methylethyl]phenyl]ethane, 1,1-bis(4-hydroxy-3-methylphenyl)-1-[4-[1-(4-hydroxyphenyl)-1-methylethyl]phenyl]ethane, 1,1-bis(2,6-dimethyl-4-hydroxyphenyl)-1-[4-[1-(4-hydroxyphenyl)-1-methylethyl]phenyl]ethane, 1,1-bis(3,4-dihydroxyphenyl)-1-[4-[1-(4-hydroxyphenyl)-1-methylethyl]phenyl]ethane, 1,1-bis(3,4,5-trihydroxyphenyl)-1-[4-(1-(4-hydroxyphenyl )-1-methylethyl]phenyl]ethane, 4,4',4",4'"-(1,4-phenylenedimethylidyne)tetrakisphenol, 4,4'-[(3-hydroxyphenyl)methylene]bis[2-methylethylphenol], 2,2'-[(3-hydroxyphenyl)methylene]bis[3,5,6-trimethylphenol], 2,2'-[(2-hydroxy-3-methoxylphenyl)methylene]bis[3,5-dimethylphenol], 2,2'-[(4-hydroxy-3-methoxyphenyl)methylene]bis[3,5-dimethylphenol], 4-[bis(4-hydroxyphenyl)methyl]-2-ethoxyphenol, 4-[bis(4-hydroxyphenyl)methyl]-2-methoxyphenol, 2,4,6-tris(4-hydroxyphenylmethyl)1,3-benzenediol, 4,4'-[1-[4-[1-(4-hydroxyphenyl)-1-methylethyl]phenyl]ethylidene]bisphenol, 4-(2,3,5-trimethyl-4-hydroxyphenyl)methyl-1,3-benzenediol, 6,6'-methylenebis[4-(4-hydroxy-3,5-dimethylphenylmethyl)-1,2,3-benzenetriol], 2,6-bis[(2,4-dihydroxyphenyl)methyl]-4-ethylphenol, 2,4-bis[(2,4-dihydroxyphenyl)methyl]-6-cyclohexylphenol, 2,6-bis[[2,3-dihydroxy-5-(1,1-dimethylethyl)phenyl]methyl]-4-methylphenol, 4,4'-[(3,4-dihydroxyphenyl)methylene]bis[2-(methylethyl)phenol], 2,2'-[(3,4-dihydroxyphenyl)methylene]bis[3,5,6-trimethylphenol], 2,2'-[(3-hydroxy4-methoxyphenyl)methylene]bis[3,5-dimethylphenol], 2,4',4"-methylidynetrisphenol, 4,4'-[(2-hydroxyphenyl)methylene]bis[3-methylphenol], 4,4',4"-(3-methyl-1-propanyl-3-ylidene)trisphenol, 2,2'-[(3-hydroxyphenyl)methylene]bis[3,5-dimethylphenol], 4,4',4",4'"-(1,2-ethanediylidene)tetrakisphenol, 4,6-bis[(4-hydroxyphenyl)methyl]-1,3-benzenediol, 4,4'-[(3,4-dihydroxyphenyl)methylene]bis[2-methylphenol], 2,2'-[(2-hydroxyphenyl)methylene]bis[3,5-dimethylphenol], 2,2'-[(4-hydroxyphenyl)methylene]bis[3,5-dimethylphenol], (2,4-dihydroxyphenyl)(4-hydroxyphenyl)methane, 4-[1-(4-hydroxyphenyl)-1-methylethyl]-1,3-benzenediol, 4-[(3,5-dimethyl-4-hydroxyphenyl)methyl]-1,2,3-benzenetriol, 4,4'-[1,4-phenylenebis(1-methylethylidene)]bis[benzene-1,2-diol], 5,5'-[1,4-phenylenebis(1-methylethylidene)]bis[benzene-1,2,3-triol], 4-[(2,3,5-trimethyl-4-hydroxyphenyl)methyl]-1,2,3-benzenetriol, 4,4'-methylenebis[6-methylcarbonyl-1,3-benzenediol], 6,6'-methylenebis[4-(4-hydroxyphenylmethyl)-1,2,3-benzenetriol], 6,6'-ethylidenebis[4-(4-hydroxyphenylcarboxy)-1,2,3-benzenetriol], 4,4',4"-methylidynetris[2,6-bis[(hydroxyphenyl)methyl]phenol], 4,4',4"-ethylidenetris[2,6-bis[(hydroxyphenyl)methyl]phenol], 2,2'-bis[(3,4-dihydroxyphenyl)methylene]bis[3,5-dimethylphenol], 4-[(4-hydroxyphenyl)methyl]-1,2,3-benzenetriol, and 4,4'-[1,4-phenylenebis(1-methylethylidene)]bis[benzene-1,2,3-triol].

Additional examples of polyhydroxy phenols can be found in U.S. Pat. Nos. 4,863,828; 5,087,548; 5,110,706; 5,238,775; 5,290,658; 5,318,875, 5,380,618; 5,397,679; 5,407,778; 5,413,896, 5,429,904, 5,429,905, and 5,556,995 and in European published application No. 0 554 101, each incorporated herein by reference for disclosure of suitable polyhydroxy phenols in accordance with this invention. Some polyhydroxy phenols are exemplified by the following formulae:

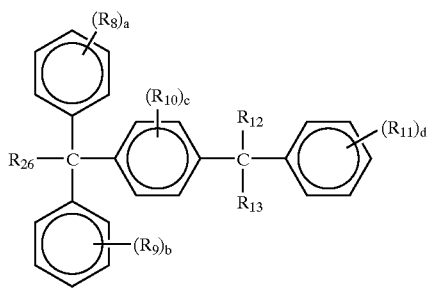

wherein $R_8$, $R_9$, $R_{10}$, $R_{11}$, $R_{12}$, $R_{13}$ and $R_{26}$ are each independently hydrogen, an unsubstituted or substituted $C_{1-6}$ alkyl group, an unsubstituted or substituted $C_{6-10}$ aryl or hydroxyl;

a, b, c and d are each independently integers from 0 to 5.

The substituted or unsubstituted alkyl group includes, for example, methyl, ethyl, n-propyl, isopropyl, n-butyl, t-butyl, cyclohexyl, hydroxymethyl, chloromethyl, bromomethyl, 2-chloromethyl, trimethylsilylmethyl groups, and the like. The substituted or unsubstituted aryl group includes, for example, phenyl, benzyl, cumyl, 1-naphthyl, 2-naphthyl, 4-hydroxyphenyl, 4-trimethylsiloxyphenyl, 4-methoxyphenyl and 4-acetylphenyl groups, and the like.

The groups $R_8$ to $R_{11}$ bonded to respective benzene rings may be the same or different and each of $R_8$ to $R_{11}$ may comprise two or more different groups, and at least one of the groups $R_8$, $R_9$ and $R_{11}$ contains at least one hydroxy group.

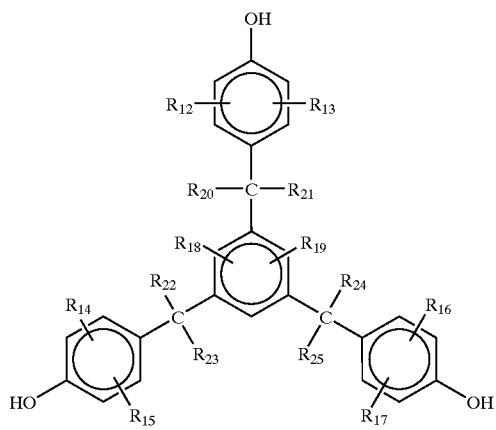

wherein $R_{12}$ to $R_{17}$ are H, halogen, $C_{1-6}$ alkyl, alkenyl or OH, $R_{18}$ and $R_{19}$ are H, halogen or $C_{1-6}$ alkyl, and $R_{20}$ to $R_{25}$ are H or $C_{1-6}$ alkyl

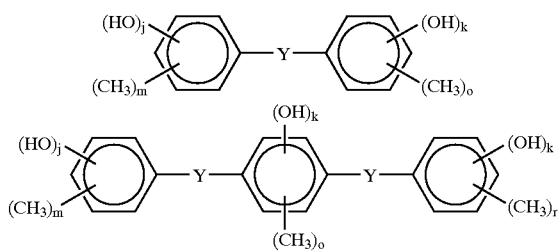

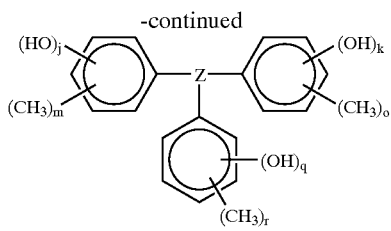

wherein Y is selected from —C—; —C(CH3)2—, or —O—; Z is selected from —C— or —C(CH3)2—; and each of j, k and q is independently an integer of 0 to 3 (provided that all of j, k and q cannot be zero), and each of m, o and r is independently an integer of 0 to 3 (provided that none of (j+m), (k+o) and (q+r) exceed four).

The solvent utilized in the compositions of the present invention includes, for example, solvents such a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxy-carboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof. The preferred solvent or solvent blend can be selected from 2-heptanone, either alone or in combination with anisole; ethyl lactate, either alone or in combination with n-butyl acetate or propylene glycol methyl ether; or propylene glycol methyl ether, either alone or in combination with ethyl 3-ethoxypropionate. When used in combination, the mixing weight ratio is usually from about 10:0 to about 0:10, more preferably from about 9:1 to about 7:3. A preferred solvent is a combination of solvents which can be selected from propylene glycol methyl ether and ethyl 3-ethoxypropionate; 2-heptanone and anisole; or ethyl lactate and n-butyl acetate.

According to the present invention, a novolak resin is partially esterifed with from about 3 to about 7 weight percent of a DNQ group. The esterified novolak resin is utilized as the film-forming resin in a photoresist composition. With an addition of the dilution resins, the esterification range of DNQ is generally reduced by up to about 20%.

In addition, in a more preferred embodiment of the present invention, the use of the most preferred photoresist solvent mixtures provides a photoresist composition capable of forming a film of the desired thickness on a substrate at a much lower solids level in the photoresist composition. The solids level includes the partially esterified novolak resin, the one or more dilution resins, and optional solid additives.

The photoresist composition may also contain various ingredients well known to those skilled in the art, such as, colorants, dyes, photoactive compounds antistriation agents, leveling agents, plasticizers, adhesion promoters, speed enhancers, solvents and such surfactants as nonionic surfactants which may be added to the composition of the present invention before the composition is coated onto a substrate. Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) Examples of photoactive compounds include, for example, one or more of (1) a reaction product between a naphthoquinonediazidesulfonyl halide (for example, 1,2-naphthoquinonediazide-5-sulfonyl halide, 7-methyl-1,2-naphthoquinonediazide-4-sulfonyl halide, 2,1-naphthoquinonediazide-4-sulfonyl halide, 2,1-naphthoquinonediazide-6-sulfonyl halide, 2,1-naphthoquinonediazide-7-sulfonyl group, and 2,1-naphthoquinonediazide-8-sulfonyl halide) or benzoquinonediazidesulfonyl halide to react with a low-molecular or high-molecular compound having at least one functional group capable of condensation reaction with these sulfonyl halides. The functional group that can be condensed with a sulfonyl halide includes a hydroxyl group, an amino group, and the like. Among these, a hydroxyl group is particularly preferable and two hydroxyl groups are more preferred. The compounds containing a hydroxyl group include, for example, hydroquinone; resorcinol; phenol, p-methoxyphenol, dimethylphenol, bisphenol A, naphthol, pyrocatechol, pyrogallol monomethyl ether, pyrogallol-1,3-dimethyl ether, gallic acid, partially esterified or partially etherified gallic acid and other phenols; 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone and 2,2',3,4,6'-pentahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone and other polyhydroxybenzophenones; hydroxyphenylalkanes such as bis(2,4-dihydroxyphenyl)methane, bis(2,3,4-trihydroxyphenyl)methane and bis(2,4-dihydroxyphenyl) propane; hydroxytriphenylmethanes such as 4,4',3",4"-tetrahydroxy-3,5,3',5'-tetramethylphenylmethane and 4,4', 2",3",4"-pentahydroxy-3,5,3',5'-tetramethyltriphenylmethane; bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl] methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane and other terminal xylenol linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol and other linear pentanuclear compounds and other linear polyphenolic compounds; bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[2,5-dimethyl-3-(2-hydroxybenzyl)-4-hydroxyphenyl]methane and other linear tetranuclear compounds; 1,1-bis(4-hydroxyphenyl)-1-[4-(4-hydroxybenzyl)phenyl]ethane, 1,1-bis(3,5-dimethyl-4-hydroxyphenyl)-1-[4-(4-hydroxybenzyl)phenyl]ethane, 1,1-bis(3,5-dimethyl-2-hydroxyphenyl)-1-[4-(4-hydroxybenzyl)phenyl]ethane, 1,1-bis(4-hydroxy-3-methylphenyl)-1-[4-(4-hydroxybenzyl) phenyl]ethane, 1,1-bis(2,6-dimethyl-4-hydroxyphenyl)-1-[4-(4-hydroxybenzyl)phenyl]ethane, 1,1-bis(3,4-dihydroxyphenyl)-1-[4-(4-hydroxybenzyl)phenyl]ethane, 1,1-bis(3,4,5-trihydroxyphenyl)-1-[4-(4-hydroxybenzyl) phenyl]ethane, 1,1-bis(4-hydroxyphenyl)-1-[4-[1-(4-hydroxyphenyl)-1-methylethyl]phenyl]ethane, 1,1-bis(3,5-dimethyl-4-hydroxyphenyl)-1-[4-[1-(4-hydroxyphenyl)-1-methylethyl]phenyl]ethane, 1,1-bis(3,5-dimethyl-2-hydroxyphenyl)-1-[4-[1-(4-hydroxyphenyl)-1-methylethyl] phenyl]ethane, 1,1-bis(4-hydroxy-3-methylphenyl)-1-[4-[1-(4-hydroxyphenyl)-1-methylethyl] phenyl]ethane, 1,1-bis(2, 6-dimethyl-4-hydroxyphenyl)-1-[4-[1-(4-hydroxyphenyl)-1-methylethyl]phenyl]ethane, 1,1-bis(3,4-dihydroxyphenyl)-1-[4-[1-(4-hydroxyphenyl)-1-methylethyl]phenyl]ethane, 1,1-bis(3,4,5-trihydroxyphenyl)-1-[4-(1-(4-hydroxyphenyl)-1-methylethyl]phenyl]ethane, and other non-linear tetranuclear compounds; bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethy-4-hydroxyphenylmethyl)-6-methylphenol, bis(4-hydroxy-3,5-dimethylphenyl)2-hydroxyphenylmethane, bis (4-hydroxy-2,5-dimethylphenyl)2-hydroxyphenylmethane, bis(4-hydroxy-3,5-dimethylphenyl) 3,4-dihydroxyphenylmethane, 1-[1-(4-hydroxyphenyl) isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane and other hydroxyaryls.

Another example includes (2) the compounds shown in formulae (I) and (II) below:

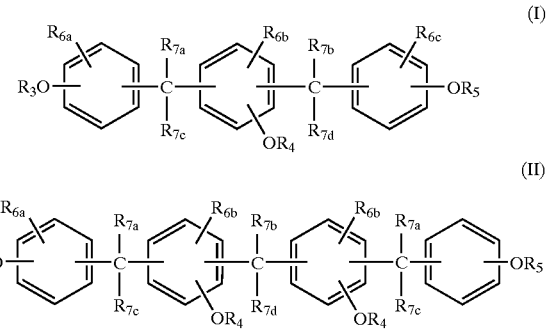

wherein $R_3$, $R_4$ and $R_5$ are independently selected from the group consisting of a hydrogen atom, a 1,2-naphthoquinonediazide-4-sulfonyl group, a 1,2-naphthoquinonediazide-5-sulfonyl group, a 7-methyl-1,2-naphthoquinonediazide-4-sulfonyl group, a 2,1-naphthoquinonediazide-4-sulfonyl group, a 2,1-naphthoquinonediazide-6-sulfonyl group, a 2,1-naphthoquinonediazide-7-sulfonyl group, a 2,1- naphthoquinonediazide-8-sulfonyl group, and mixtures thereof, and $R_3$, $R_4$ and $R_5$ cannot be a hydrogen atom at the same time, $R_{6a}$, $R_{6b}$, $R_{6c}$, $R_{7a}$, $R_{7b}$, $R_{7c}$, and $R_{7d}$ are independently selected from a hydrogen atom or $C_{1-4}$ alkyl group, and n represents 1 or 2.

Examples of compounds of formula (II) include

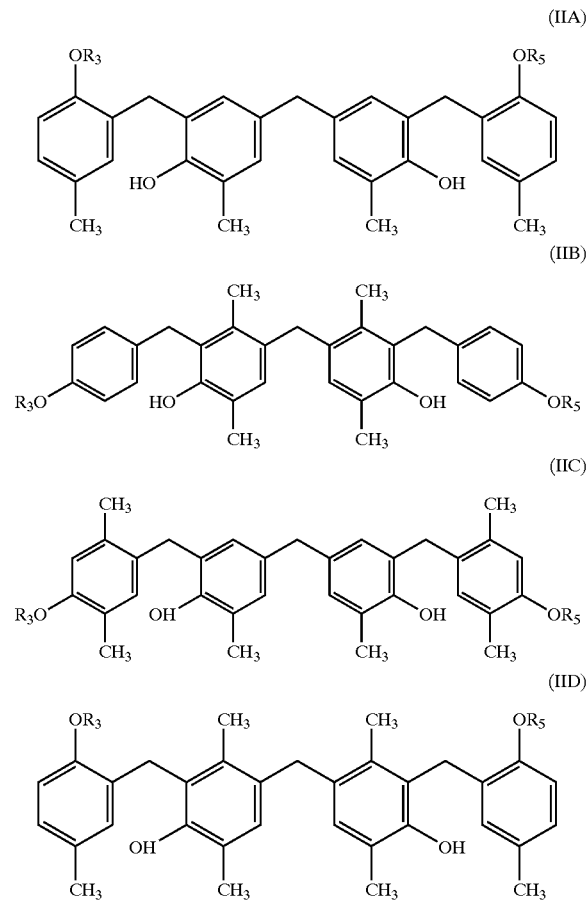

where $R_3$ and $R_5$ are not hydrogen.

The prepared composition can be applied to a substrate by any conventional method used in the photoresist art, including dipping, spraying, whirling and spin coating. When spin coating, for example, the photoresist solution can be adjusted with respect to the percentage of solids content in order to provide coating of the desired thickness given the type of spinning equipment utilized and the amount of time allowed for the spinning process.

Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group IIIN compounds. The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters. The substrate may have an adhesion promoted layer of a suitable composition such as one containing hexa-alkyl disiiazane.

The photoresist composition solution is then coated onto the substrate, and the substrate is temperature treated at from about 80° C. to about 110° C. for from about 30 seconds to about 180 seconds on a hot plate or for from about 15 to about 40 minutes in a convection oven. This temperature treatment is selected in order to reduce the concentration of residual solvents in the photoresist while not causing substantial thermal degradation of the composition components. In general one desires to minimize the concentration of solvents and thus this first temperature treatment is conducted until substantially all of the solvents have evaporated and a thin coating of photoresist composition, on the order of a micron in thickness, remains on the substrate. In a preferred embodiment the temperature is conducted at from about 85° C. to about 95° C. The treatment is conducted until the rate of change of solvent removal becomes relatively insignificant. The temperature and time selection depends on the photoresist properties desired by the user as well as equipment used and commercially desired coating times. The coating substrate can then be exposed to actinic radiation, especially ultraviolet radiation, at a wavelength of from about 150 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 150° C., more preferably from about 110° C. to about 150° C. The heating may be conducted for from about 10 seconds to about 30 minutes, more preferably from about 45 seconds to about 90 seconds on a hot plate or about 10 to about 30 minutes by convection oven.

The exposed photoresist-coated substrates are developed to remove the imagewise exposed, non-image areas by spray developing using an alkaline developing solution. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. A suitable developer is AZ 300 MIF Developer available commercially from the Clariant Corporation, Somerville, N.J. After removal of the coated wafers from the developing solution, one may conduct an optional post-development heat treatment or bake in increase the coating's adhesion and chemical photoresistance to etching solutions and other substances. The post-development heat treatment can comprise the oven baking of the coating and substrate below the coating's softening point. The industrial applications, particularly in the manufacture of microcircuitry units on silicon/silicon dioxide type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

Examples of the present invention are set forth below, by way of illustration and not limitation. Unless otherwise noted, all parts and percentages herein are by weight; molecular weight is weight average molecular weight, all temperatures are degrees Centigrade.

EXAMPLE 1

A meta-cresol/para-cresol novolak resin was reacted with sufficient amount of 1,2-naphthoquinonediazide-4-sulfonyl chloride under appropriate reaction conditions to form a novolak resin that was partially esterified, at 4.5%, with 1,2-naphthoquinonediazide-4-sulfonyl groups. This resin was provided in a solution at 35% active solids in a solvent blend of propylene glycol methyl ether and ethyl 3-ethoxypropionate (in a ratio of 8:2). 57.14 grams of the partially esterified novolak resin was then mixed with 4.97 grams of a dilution resin (a 1:1 ratio of 4,4'-[1-[4-[1-(4-hydroxyphenyl)-1-methylethyl]phenyl]ethylidene] bisphenol (TPPA) and an m-cresol:p-cresol:trimethylphenol (3:5:2 parts)/formaldehyde resin; 35% active solids in a solvent blend of propylene glycol methyl ether and ethyl 3-ethoxypropionate (in a ratio of 8:2)) and approximately 0.8 grams (5% active solids) of dimethylsiloxane methyl polyoxyethylene siloxane copolymer. This results in a composition on total resin solids of about 4% TPPA, about 4% m-cresol:p-cresol:trimethylphenol (3:5:2 parts)/formaldehyde resin, and about 92% of the partially esterified novolak resin.

The composition of Example 1 was applied to a silicon wafers at 4,000 rpm and then soft-baked on a proximity hotplate oven at 90° C. for about 90 seconds to form a film thickness of 3.0 µm. Actinic exposure was applied using a ASML i-250 stepper through a glass photomask containing a resolution test pattern. The coated wafers were exposed at varying doses ranging from 210 mJ/cm² to 260 mJ/cm² with nominal exposure for 1 µm is 230 mJ/cm².

After exposure, the wafers were post exposure baked on a proximity hot plate at 110° C. for about 90 seconds.

The wafers were subsequently developed with AZ 300 MIF Developer using a single puddle at 23° C. for about 60 seconds.

While described in terms of the presently preferred embodiments, it is to be understood that the present disclosure is to be interpreted as by way of illustration, and not by way of limitation, and that various modifications and alterations apparent to one skilled in the art may be made without departing from the scope and spirit of the present invention.

What is claimed is:

1. A composition comprising: a) a novolak resin partially esterified with from about 3 to about 7 weight percent of a naphthoquinonediazidosulfonyl group; b) a dilution resin mixture of a non-esterified novolak resin and polyhydroxy phenols; and c) at least one solvent.

2. The composition of claim 1 wherein for a) the naphthoquinonediazidosulfonyl group is selected from 1,2-naphthoquinonediazide-4-sulfonyl group, a 1,2-naphthoquinonediazide-5-sufonyl group, a 7-methyl-1,2-naphthoquinonediazide-4-sulfonyl group, a 2,1-naphthoquinonediazide-4-sulfonyl group, a 2,1-naphthoquinonediazide-6-sulfonyl group, a 2,1-naphthoquinonediazide-7-sulfonyl group, and a 2,1-naphthoquinonediazide-8-sulfonyl group.

3. The composition of claim 2 wherein for a) the naphthoquinonediazidosulfonyl group is a 1,2-naphthoquinonediazide-4-sulfonyl group or a 1,2-naphthoquinonediazide-5-sulfonyl group.

4. The composition of claim 1 wherein for b) the non-esterified novolak resin is selected from a resin formed by a condensation reaction between trimethylphenol and formaldehyde, a resin formed by a condensation reaction between acetone and pyrogallol, a resin formed by a condensation reaction between m-cresol, p-cresol, trimethylphenol, and formaldehyde or mixtures thereof.

5. The composition of claim 1 wherein for b) the polyhydroxy phenols is selected from the group consisting of 1,1-bis(4-hydroxyphenyl)-1-[4-(4-hydroxybenzyl)phenyl]ethane, 1,1-bis(3,5-dimethyl-4-hydroxyphenyl)-1-[4-(4-hydroxybenzyl)phenyl]ethane, 1,1-bis(3,5-dimethyl-2-hydroxyphenyl)-1-[4-(4-hydroxybenzyl)phenyl]ethane, 1,1-bis(4-hydroxy-3methylphenyl)-1-[4-(4-hydroxybenzyl)phenyl]ethane, 1,1-bis(2,6-dimethyl-4-hydroxyphenyl)-1-[4-(4-hydroxybenzyl)phenyl]ethane, 1,1-bis(3,4-dihydroxyphenyl)-1-[4-(4-hydroxybenzyl)phenyl]ethane, 1,1-bis(3,4,5-trihydroxyphenyl)-1-[4-(4-hydroxybenzyl)phenyl]ethane, 1,1-bis(3,5-dimethyl-4-hydroxyphenyl)-1-[4-[1-(4-hydroxyphenyl)-1-methylethyl]phenyl]ethane, 1,1-bis(3,5dimethyl-2-hydroxyphenyl)-1-[4-[1-(4-hydroxyphenyl)-1-methylethyl]phenyl]ethane, 1,1-bis(4hydroxy-3-methylphenyl)-1-[4-[1-(4-hydroxyphenyl)-1-methylethyl]phenyl]ethane, 1,1-bis(2,6-dimethyl-4-hydroxyphenyl)-1-[4[-1-(4-hydroxyphenyl)-1-methylethyl]phenyl]ethane, 1,1-bis(3,4dihydroxyphenyl)-1-[4-[1-(4-hydroxyphenyl)-1-methylethyl]phenyl]ethane, 1,1-bis(3,4,5-trihydroxyphenyl)-1-[4-(1-(4-hydroxyphenyl)-1-methylethyl]phenyl]ethane, 4,4',4",4'"-(1,4-phenylenedimethylidyne)tetrakisphenol, 4,4'-[(3-hydroxyphenyl)methylene]bis[2-methylethylphenol], 2,2'-[(3-hydroxyphenyl)methylene]bis[3,5,6-trimethylphenol], 2,2'-[(2-hydroxy-3-methoxylphenyl)methylene]bis[3,5dimethylphenol], 2,2'-[(4-hydroxy-3-methoxyphenyl)methylene]bis[3,5-dimethylphenol], 4[bis(4-hydroxyphenyl)methyl]-2-ethoxyphenol, 4[bis(4-hydroxyphenyl)methyl]-2-methoxyphenol, 2,4,6-tris(4-hydroxyphenylmethyl)-1,3-benzenediol, 4,4'-[1-[4-[1-(4-hydroxyphenyl)-1-methylethyl]phenyl]ethylidene] bisphenol, 4-(2,3,5-trimethyl-4hydroxyphenyl)methyl-1,3-benzenediol, 6,6'-methylenebis[4-(4-hydroxy-3,5-dimethylphenylmethyl)-1,2,3-benzenetriol], 2,6-bis[(2, 4dihydroxyphenyl)methyl]-4-ethylphenol, 2,4bis[(2,4-dihydroxyphenyl)methyl-6-cyclohexylphenol, 2,6-bis[[2,3-dihydroxy-5-(1,1-dimethylethyl)phenyl]methyl]-4-methylphenol, 4,4'-[(3,4-dihydroxyphenyl)methylene]bis[2-(methylethyl)phenol], 2,2'-[(3,4-dihydroxyphenyl)methylene]bis[3,5,6-trimethylphenol], 2,2'-[(3-hydroxy4-methoxyphenyl)methylene]bis[3,5-dimethylphenol], 2,4',4"-methylidynetrisphenol, 4,4'-[(2-hydroxyphenyl)methylene]bis[3-(methylphenol], 4,4',4"-(3-methyl-1-propanyl-3-ylidene)trisphenol, 2,2'-[(3-hydroxyphenyl)methylene]bis[3,5-dimethylphenol], 4,4',4",4'"-(1,2-ethanediylidene)tetrakisphenol, 4,6-bis[(4-hydroxyphenyl)methyl]-1,3-benzenediol, 4,4'-[(3,4-dihydroxyphenyl)methylene]bis[2-methylphenol], 2,2'-[(2-hydroxyphenyl)methylene]bis[3,5-dimethylphenol], 2,2'-[(4-hydroxyphenyl)methylene]bis[3,5-dimethylphenol], (2,4-dihydroxyphenyl)(4-hydroxyphenyl)methane, 4-[1-(4-hydroxyphenyl)-1-methylethyl]-1,3-benzenediol, 4-[(3,5-dimethyl-4-hydroxyphenyl)methyl]-1,2,3-benzenetriol, 4,4'-[1,4-phenylenebis(1-methylethylidene)]bis[benzene-1, 2-diol], 5,5'-[1,4-phenylenebis(1-methylethylidene)]bis[benzene-1,2,3-triol], 4(2,3,5-trimethyl-4-hydroxyphenyl) methyl]-1,2,3-benzenetriol, 4,4'-methylenebis[6-methylcarbonyl-1,3-benzenediol], 6,6'-methylenebis[4-(4-hydroxyphenylmethyl)-1,2,3-benzenetriol], 6,6'-ethylidenebis[4-(4-hydroxyphenylcarboxy)-1,2,3-benzenetriol], 4,4',4"-methylidynetris[2,6-bis[(hydroxyphenyl)methyl]phenol], 4,4',4"-ethylidenetis[2,6-bis[(hydroxyphenyl)methyl]phenol], 2,2'-bis[(3, 4dihydroxyphenyl)methylene]bis[3,5-dimethylphenol], 4-[(4-hydroxyphenyl)methyl]-1,2,3-benzenetriol, and 4,4'-[1,4-phenylenebis(1-methylethylidene)]bis [benzene-1,2,3-triol].

6. The composition of claim 1 wherein for b) the non-esterified novolak resin is a resin formed by a condensation reaction between trimethylphenol and formaldehyde and the polyhydroxy phenol is 4,4'-[1-[4-[1-(4hydroxyphenyl)-1-methylethyl]phenyl]ethylidene]bisphenol.

7. The composition of claim 1 wherein for b) the non-esterified novolak resin is a resin formed by a condensation reaction between m-cresol. p-cresol, trimethylphenol, and formaldehyde and the polyhydroxy phenol is 4,4'-[1-[4-[1-(4-hydroxyphenyl-1-methylethyl]phenyl]ethylidene] bisphenol.

8. The composition of claim 1 wherein c) at least one solvent is selected from 2-heptanone, anisole, ethyl lactate, n-butyl acetate, propylene glycol methyl ether, propylene glycol methyl ether, ethyl 3-ethoxypropionate and mixtures thereof.

9. The composition of claim 8 wherein c) at least one solvent is a mixture of 2-heptanone and anisole.

10. The composition of claim 8 wherein c) at least one solvent is a mixture of ethyl lactate and with n-butyl acetate.

11. The composition of claim 8 wherein c) at least one solvent is a mixture of ethyl lactate and propylene glycol methyl ether.

12. The composition of claim 8 wherein c) at least one solvent is a mixture of propylene glycol methyl ether and ethyl 3-ethoxypropionate.

13. The composition of claim 1 which further comprises a photosensitive compound.

14. The composition of claim 13 wherein the photosensitive compound is selected from a reaction product between a naphthoquinonediazidesulfonyl halide or benzoquinonediazidesulfonyl halide and a compound containing at least one hydroxyl group selected from hydroquinone; resorcinol; phenol, p-methoxyphenol, dimethylphenol, bisphenol A, naphthol, pyrocatechol, pyrogallol monomethyl ether, pyrogallol-1,3-dimethyl ether, gallic acid, partially esterified or partially etherified gallic acid and other phenols; 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone, 2,2',3,4,6'-pentahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone and other polyhydroxybenzophenones; bis(2,4-dihydroxyphenyl)methane, bis(2,3,4-trihydroxyphenyl)methane, bis(2,4dihydroxyphenyl)propane and other hydroxyphenylalkanes; 4,4',3",4"-tetrahydroxy-3,5,3',5'-tetramethylphenylmethane, 4,4',2",3",4"-pentahydroxy-3,5, 3',5'-tetramethyltriphenylmethane and other hydroxytriphenylmethanes; bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane and other terminal xylenol linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol and other linear pentanuclear compounds and other linear polyphenolic compounds; bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, bis[2,5-dimethyl-3-(4-hydroxy-5methylbenzyl)-4 hydroxyphenyl]methane, bis[2,5-dimethyl-3-(4-hydroxybenzyl)-4-hydroxyphenyl]methane, bis[2,5-dimethyl-3-(2-hydroxybenzyl)-4-hydroxyphenyl]methane and other linear tetranuclear compounds; 1,1-bis(4-hydroxyphenyl)-1-[4-(4-hydroxybenzyl)phenyl]ethane, 1,1-bis(3,5-dimethyl-4-hydroxyphenyl)-1-[4-(4-hydroxybenzyl)phenyl]ethane, 1,1-bis(3,5-dimethyl-2-hydroxyphenyl)-1-[4-(4-hydroxybenzyl)phenyl]ethane, 1,1-bis(4-hydroxy-3-methylphenyl)-1-[4-(4-hydroxybenzyl)phenyl]ethane, 1,1-bis(2,6-dimethyl-4-hydroxyphenyl)-1-[4-hydroxybenzyl)phenyl]ethane, 1,1-bis(3,4-dihydroxyphenyl)-1-[4-(4-hydroxybenzyl)phenyl]ethane, 1,1-bis(3,4,5-trihydroxyphenyl)-1-[4-(4-hydroxybenzyl)phenyl]ethane, 1,1-bis(4-hydroxyphenyl)-1-[4-[1-(4-hydroxyphenyl)-1-methylethyl]phenyl]ethane, 1,1-bis(3,5-dimethyl-4-hydroxyphenyl)-1-[4-[1-(4-hydroxyphenyl)-1-methylethyl]phenyl]ethane, 1,1-bis(3,5dimethyl-2-hydroxyphenyl)-1-[4-[1-(4-hydroxyphenyl)-1-methylethyl]phenyl]ethane, 1,1-bis(4-hydroxy-3-methylphenyl)-1-[4-[1-(4-hydroxyphenyl)-1-methylethyl]phenyl]ethane, 1,1-bis(2,6-dimethyl-4-hydroxyphenyl)-1-[4-[1-(4-hydroxyphenyl)-1-methylethyl]phenyl]ethane, 1,1-bis(3,4-dihydroxyphenyl)-1-[4-[1-(4-hydroxyphenyl)-1-methylethyl]phenyl]ethane, 1,1-bis(3,4,5-trihydroxyphenyl)-1-[4-(1-(4-hydroxyphenyl)-1-methylethyl]phenyl]ethane, and other non-linear tetranuclear compounds; bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl-4-methylphenol, 2,6-bis(2,3,4-trihydroxyphenylmethyl)-4-methylphenol, 1,1-bis(4-hydroxyphenyl)cyclohexane and other hydroxyaryls, and a compound represented by formula (I) or (II)

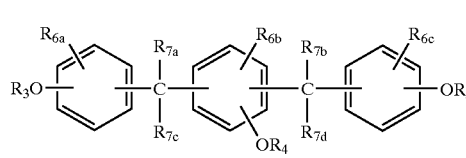

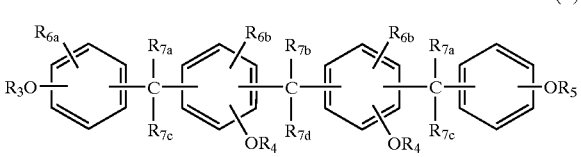

wherein $R_3$, $R_4$ and $R_5$ are independently selected from the group consisting of a hydrogen atom, a 1,2-naphthoquinonediazide-4-sulfonyl group, a 1,2-naphthoquinonediazide-5-sulfonyl group, a 7-methyl-1,2 naphthoquinonediazide-4-sulfonyl group, a 2,1-naphthoquinonediazide-4-sulfonyl group, a 2,1-naphthoquinonediazide-6-sulfonyl group, a 2,1-naphthoquinonediazide-7-sulfonyl group, a 2,1-naphthoquinonediazide-8-sulfonyl group, and mixtures thereof, and $R_3$, $R_4$ and $R_5$ cannot be a hydrogen atom at the same time, $R_{6a}$, $R_{6b}$, $R_{6c}$, $R_{7a}$, $R_{7b}$, $R_{7c}$, and $R_{7d}$ are independently selected from a hydrogen atom or $C_{1-4}$ alkyl group, and n represents 1 or 2.

15. A process for preparing a composition comprising providing an admixture of: a composition comprising: a)

novolak resin partially esterified with from about 3 to about 7 weight percent of a naphthoquinonediazidosulfonyl group; b) a dilution resin mixture of a non-esterified novolak resin and polyhydroxy phenols; and c) at least one solvent.

16. A process for forming an image on a substrate comprising coating a substrate with a composition according to claim 1; imagewise exposing through a mask with ultraviolet radiation; and developing the exposed photoresist composition with a developer.

* * * * *